United States Patent
Saito

(10) Patent No.: US 10,218,329 B2
(45) Date of Patent: Feb. 26, 2019

(54) AUDIO PROCESSING APPARATUS AND METHOD FOR PREVIEWING PARAMETER

(71) Applicant: Yamaha Corporation, Hamamatsu-shi, Shizuoka-Ken (JP)

(72) Inventor: Kosuke Saito, Hamamatsu (JP)

(73) Assignee: Yamaha Corporation, Hamamatsu-shi (JP)

(*) Notice: Subject to any disclaimer, the term of this patent is extended or adjusted under 35 U.S.C. 154(b) by 0 days.

(21) Appl. No.: 15/896,321

(22) Filed: Feb. 14, 2018

(65) Prior Publication Data
US 2018/0234068 A1    Aug. 16, 2018

(30) Foreign Application Priority Data

Feb. 15, 2017   (JP) .................................. 2017-026255

(51) Int. Cl.
| | |
|---|---|
| *H03G 3/00* | (2006.01) |
| *H03G 5/02* | (2006.01) |
| *G11B 27/031* | (2006.01) |
| *H03G 1/00* | (2006.01) |
| *H03G 3/02* | (2006.01) |
| *H03G 7/00* | (2006.01) |

(52) U.S. Cl.
CPC ........... *H03G 5/025* (2013.01); *G11B 27/031* (2013.01); *H03G 1/0005* (2013.01); *H03G 3/002* (2013.01); *H03G 3/02* (2013.01); *H03G 7/007* (2013.01)

(58) Field of Classification Search
CPC ...................................................... H03G 3/00
See application file for complete search history.

(56) References Cited

U.S. PATENT DOCUMENTS

| | | | | |
|---|---|---|---|---|
| 2002/0156547 | A1* | 10/2002 | Suyama | ................ H04H 60/04 700/94 |
| 2004/0179695 | A1* | 9/2004 | Terada | ................... H04H 60/04 381/56 |
| 2016/0277857 | A1 | 9/2016 | Okabayashi | |
| 2016/0283186 | A1 | 9/2016 | Terada | |

FOREIGN PATENT DOCUMENTS

| | | |
|---|---|---|
| JP | 4003639 B2 | 11/2007 |
| JP | 4066254 B2 | 3/2008 |
| JP | 2016-178391 A | 10/2016 |
| JP | 2016-181833 A | 10/2016 |

* cited by examiner

*Primary Examiner* — Olisa Anwah

(74) *Attorney, Agent, or Firm* — Crowell & Moring LLP

(57) ABSTRACT

Each input channel adjusts a level of an audio signal by individual first parameters and outputs the level-adjusted audio signals to individual output routes that include bus channels. Each bus channel mixes the level-adjusted audio signals and processes the mixed audio signal by a second parameter to output to a main output. A preview channel adjusts a level of the audio signal of each of input channels by a third parameter, mixes the level-adjusted audio signals of the input channels and processes the mixed audio signal by a fourth parameter to output to a monitor output. In response to a preview instruction, the first parameter of the input channel is copied as the third parameter, and the second parameter of the bus channel is copied as the fourth parameter of the preview channel. In response to an adjustment instruction, the third or fourth parameter of the preview channel is changed.

8 Claims, 6 Drawing Sheets

AUDIO PROCESSING APPARATUS AND METHOD FOR PREVIEWING PARAMETER

FIELD OF THE INVENTION

The present invention relates an audio processing apparatus suited for use, for example, in an audio mixer having a plurality of channels, and a method for previewing a parameter set in the audio processing apparatus.

BACKGROUND OF THE INVENTION

Audio mixers (also referred to simply as "mixers") are constructed basically in such a manner that signal processing, such as control of various characteristics and level adjustment, are performed, in individual ones of a plurality of channels, on audio signals supplied from external sound sources via an input (having a plurality of jacks) of the mixer, the thus-processed audio signals are mixed by means of buses of a main output route, the thus-mixed audio signal are processed by means of output channels and then the thus-processed audio signals are output to the main output (having a plurality of jacks). To the main output are connected main speakers for amplifying the audio signals and audibly outputting the amplified audio signals to the venue, wedge speakers for audibly outputting the audio signals to human players (or human performers), etc. A user (i.e., human operator of the mixer) sets, for each of a plurality of input channels, send gains to the buses (i.e., gains of audio signals to be sent to the buses) so that a mixing ratio of the audio signals in the mixed audio signal of each of the buses can be adjusted. The gain is a value in decibels, and the gain in positive value indicates amplification of the audio signal while the gain in negative value indicates attenuation of the audio signal.

In the conventionally-known mixers, a "CUE" function has been known which, for permitting user's test-listening, outputs an audio signal of a desired channel, selected as an object of test-listening, from a monitor output different from a main output without affecting an audio signal of an main output route. User's headphones etc. are connected to the monitor output. According to the disclosure in Japanese Patent No. 4003639, a send gain to a monitor bus for test-listening is set separately from a send gain to a bus of a main output route, a plurality of audio signals are mixed in the monitor bus, and the resultant mixed audio signal is output via a monitor output.

With the conventionally-known cue function, however, it is not possible to adjust a parameter of a currently test-listened-to audio signal without affecting an audio signal of the main output route. But, with a conventionally-known preview function of a mixer, a user can adjust a signal processing parameter of a desired audio signal, selected as an object of test-listening, without affecting an audio signal of the main output while listening to an audio signal of the monitor output. Japanese Patent Application Laid-open Publication No. 2016-181833 discloses, as an example of the preview function, that a temporary channel is created, in response to a preview start instruction of a given input channel, for a monitor output purpose such that the same audio signal as supplied to the given input channel is supplied to the thus-created temporary channel, and that a value of a parameter of signal processing (signal processing parameter) of the given input channel is copied to the temporary channel so that the parameter of the signal processing to be performed on the supplied audio signal is adjusted in the temporary channel. Further, Japanese Patent Application Laid-open Publication No. 2016-178391 discloses that a non-temporary cue output channel is provided for a monitor output purpose such that, in response to a preview start instruction of a given output channel, the same audio signal as supplied to the given output channel is supplied to the thus-created cue output channel, and that a value of a parameter of signal processing of the given output channel is copied to the cue output channel so that the parameter of the signal processing to be performed on the supplied audio signals can be adjusted in the cue output channel in response to a user's operation.

Furthermore, Japanese Patent No. 4066254 discloses a method for readily setting a value of a send gain from each of input channels to a bus for a wedge speaker in a conventional speaker, which particularly discloses a technique for, in response to a user's instruction, copying a value of a send gain from each of the input channels to a bus for a main speaker as a send gain from that input channel to the wedge speaker.

However, with the conventionally-known preview function, in previewing a mixed audio signal of a given output channel selected as an object-of previewing (object-of-previewing output channel), it is not possible for a user to adjust a mixing ratio of a plurality of audio signals in the mixed audio signal of the object-of-previewing output channel without affecting an audio signal of a main output.

SUMMARY OF THE INVENTION

In view of the foregoing prior art problems, it is an object of the present invention to provide an audio processing apparatus which permits a user to adjust, in a monitor output channel, a mixing ratio of a plurality of audio signals in a to-be-previewed mixed audio signal and a characteristic of the mixed audio signal without affecting or changing a mixed audio signal of a main output, and a method for previewing a parameter set in the audio processing apparatus.

In order to accomplish the above-mentioned object, the present invention provides an improved audio processing apparatus, which comprises: a plurality of input channels, each of the input channels including first level adjusters that adjust a level of an input audio signal in accordance with first parameters set separately for individual ones of a plurality of output routes and send resultant level-adjusted audio signals to the individual output routes; a plurality of bus channels provided in corresponding relation to the plurality of output routes, each of the bus channels being configured to mix the audio signals sent from the plurality of input channels and outputting a resultant mixed audio signal to a main output after processing the mixed audio signal in accordance with a second parameter and; a preview channel including a plurality of second level adjusters that, in accordance with third parameters set separately for the individual input channels, adjust the audio signals taken out from the plurality of input channels, the preview channel being configured to mix the audio signals having been adjusted in level by the second level adjusters and output a resultant mixed audio signal to a monitor output after processing the mixed audio signal in accordance with a fourth parameter; and a processor configured to: in response to a preview instruction given by a user for previewing any one output route of the output routes, set a copy of the first parameter for the one output route of each of the input channels as the third parameter corresponding to the input channel in the preview channel, and set a copy of the second parameter of the bus channel corresponding to the one output route as the fourth parameter of the preview channel; and in response to an adjustment instruction given by the user, change a value of the third or fourth parameter of the preview channel.

According to the present invention, in response to a preview instruction for previewing any one of the output routes, a copy of the first parameter for the one output route for which the preview instruction has been given (i.e., previewing-instructed output route, object-of-previewing output route or previewing output route) of each of the input channels is set as the third parameter of the preview channel and a copy of the second parameter of the bus channel corresponding to the one output route is set as the fourth parameter of the preview channel, so that the same mixing ratio and signal processing parameter as in the previewing output route are set into the preview channel. In this way, the user can test-listen to the same mixed audio signal via a monitor output channel as via the previewing output route. Further, by adjusting the third parameter and/or the fourth parameter in the preview channel in accordance with an instruction given by the user, it is possible to adjust, in the monitor output channel, the mixing ratio and characteristics of the plurality of audio signals in the to-be-previewed mixed audio signal, without affecting the mixed audio signal output from the main output. As a result, the present invention can achieve the advantageous benefit that the user is allowed to adjust, in the monitor output channel, the mixing ratio and characteristics of the plurality of audio signals in the to-be-previewed mixed audio signal, without affecting or changing the mixed audio signal output from the main output.

The present invention may be constructed and implemented not only as the apparatus invention discussed above but also as a computer-implemented method invention. Also, the present invention may be implemented as a non-transitory computer-readable storage medium storing a program executable by one or more processors for performing the method.

The following will describe embodiments of the present invention, but it should be appreciated that the present invention is not limited to the described embodiments and various modifications of the invention are possible without departing from the basic principles of the invention. The scope of the present invention is therefore to be determined solely by the appended claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION OF THE INVENTION

In this description, the term "test-listen" is used to refer to a trial-listening action of a user, and the term "monitor" is used in connection with resources, such as buses, channels and output terminals, that are used for the test-listening. The terms "cue" and "preview" are both used to refer to a type of test-listening. Specifically, the term "cue" refers to a function of merely allowing the user to test-listen to an audio signal of a channel, selected as an object of test-listening, that is output from a monitor output different from a main output. The term "preview", on the other hand, refers to a function of allowing the user to adjust, in a preview channel (cue output channel 160), a parameter for processing a to-be-test-listened-to audio signal of a channel, selected as an object of test-listening, that is output from the monitor output, while test-listening to the audio signal, without affecting the main output. The "preview" according to the present invention is characterized by, in a case where an output channel is selected as an object of previewing (previewing output channel), adjusting a mixing ratio of a mixed audio signal being supplied to that output channel (i.e., respective levels of audio signals of a plurality of input channels being sent to the output channel), without affecting the main output.

Figure 1:
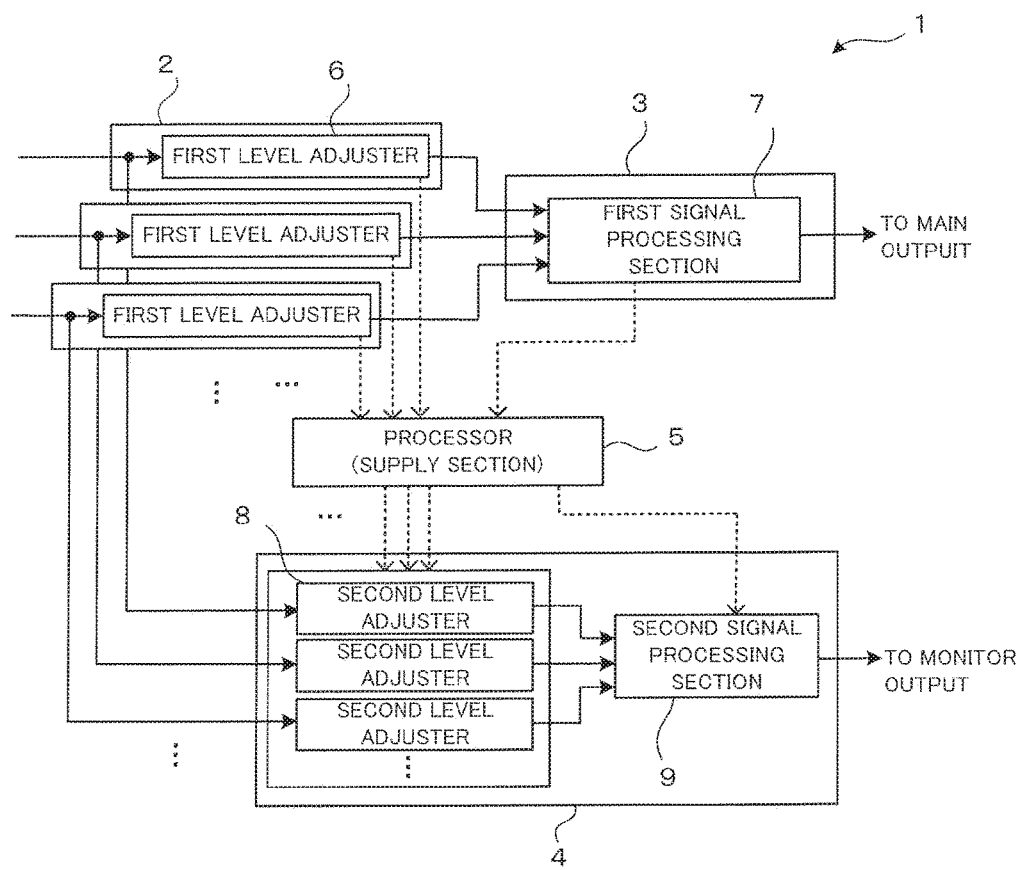
FIG. 1 is a conceptual block diagram of an audio processing apparatus according to an embodiment of the present invention.

FIG. 1 is a conceptual block diagram of an audio processing apparatus 1 according to an embodiment of the present invention. As shown in FIG. 1, the audio processing apparatus 1 includes a plurality of input channels 2 (various channels are abbreviated as "CH" in the figures). Each of the input channels 2 includes first level adjusters 6 which adjust a level of an input audio signal in accordance with first parameters set separately for individual ones of a plurality of output routes and send the resultant level-adjusted audio signals to the individual output routes. A plurality of bus channels 3 are provided in corresponding relation to the plurality of output routes. Each of the bus channels 3 is configured to mix a plurality of audio signals sent from the plurality of input channels 2, process the resultant mixed signal in accordance with a second parameter and output the processed mixed signal to a main output. In each of the bus channels 3, the processing of the mixed signal according to the second parameter is performed by a first signal processing section 7. A preview channel 4 includes a plurality of second level adjusters 8 which adjust, in accordance with third parameters set separately for the individual input channels 2, levels of audio signals extracted from the input channels 2, and the preview channel 4 is configured to mix the audio signals having been adjusted in level by the second level adjuster 8, process the resultant mixed signal in accordance with a fourth parameter and output the thus-processed mixed signal to a monitor output. In the preview channel 4, the processing of the mixed signal according to the fourth parameter is performed by a second signal processing section 9. A processor 5 functions as a supply section which supplies parameters to the preview channel 4 in accordance with various user's instructions. The processor 5 is configured to, in response to a user's preview instruction for previewing any one of the output routes, set a copy of the first parameter for that output route of each of the input channels 2 as the corresponding third parameter of the preview channel 4 and set a copy of the second parameter of the bus channel 3 corresponding to that output route as the fourth parameter of the preview channel. Further, the processor 5 is configured to, in response to a user's adjustment instruction, change the value of the third parameter or fourth parameter of the preview channel 4.

With the aforementioned arrangements, in response to a preview instruction for previewing any one of the output routes, a copy of the first parameter for the output route of each of the input channels is set as the third parameter for each of the second level adjusters 8 in the preview channel 4, and a copy of the second parameter of the bus channel 3 corresponding to the output route in question is set as the fourth parameter. Thus, the same mixing ratio and signal processing parameters as in the to-be-previewed output route (i.e., object-of-previewing output route or previewing-instructed output route) are set into the preview channel 4. In this manner, the user can test-listen to the same mixed audio signal via the monitor-outputting preview channel as via the previewing-instructed output channel. Further, by adjusting the third parameter and/or the fourth parameter of the preview channel 4, the user can adjust the mixing ratio of the plurality of audio signals in the mixed audio signal of the object-of-previewing output route and the characteristics of the mixed audio signal without affecting mixed audio signals output from the main output.

The audio processing apparatus 1 shown in FIG. 1 is applicable to audio equipment, such as an audio mixer, which handles audio signals. The embodiment of the audio processing apparatus 1 will be described in greater detail hereinbelow as applied to an audio mixer. It is assumed here that the audio mixer 10 is a digital mixer (hereinafter referred to simply as "mixer") which processes audio signals mainly by digital signal processing.

Figure 2:
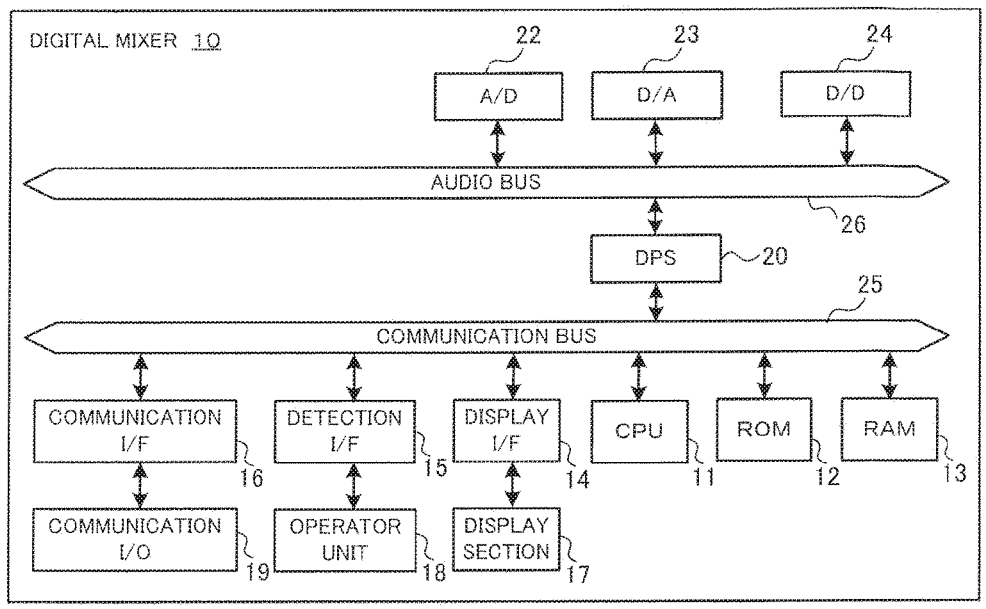
FIG. 2 is a block diagram showing an example hardware setup of a digital mixer having the audio processing apparatus applied thereto.

As shown in FIG. 2, the mixer 10 includes a CPU (Central Processing Unit) 11, a ROM (Read-Only Memory) 12, a RAM (Random Access Memory) 13, a display interface (the word "interface" will hereinafter be abbreviated as "I/F") 14, a detection I/F 15, a communication I/F 16 and a DSP (Digital Signal Processor) 20, and these components are interconnected via a communication bus 25. A display section 17 is connected to the display I/F 14, an operator unit 18 is connected to the detection I/F 15, and a communication input/output section (the input/output section will hereinafter be referred to as "I/O") 19 is connected to the communication I/F 16. The mixer 10 also includes an A/D conversion section 22, a D/A conversion section 23 and a D/D conversion section 24 that are connected to the DSP 20 via an audio bus 26.

The CPU 11, which is a control means for controlling overall operation or behavior of the mixer 10, executes predetermined programs, stored in the ROM 2, to perform various processes, such as for controlling displays on the display section 17, detection of operations on the operator unit 18, communication by the communication I/O 19, etc. via the I/Fs 14 to 16 and controlling signal processing by the DSP 20. The ROM 12 is a rewritable non-volatile storage means that stores control programs to be executed by the CPU 11 and may be in the form of a flash memory or the like.

The RAM 13 is a storage means that stores values of parameters to be reflected in the signal processing by the DSP 20 and that is used as a working memory for the CPU 11 and various other purposes. The display I/F 14 is an interface for connecting the display section 17 to the communication bus 25 and controlling displayed content of the display section 17 in accordance with an instruction given from the CPU 11. The display section 17, which is a display means in the form of a liquid crystal display (LCD) and/or the like, displays various screens, such as one displaying a current state of the mixer 10 and ones for referencing, changing, storing etc. of parameters to be used in signal processing.

The detection I/F 15 is an interface for connecting the operator unit 18 to the communication bus 25 and detecting content of operations on the operator unit 18 in accordance with instructions given from the CPU 11. The operator unit 18 includes various operating elements (i.e., operators), such as keys, switches and rotary encoders. In response to various user's operations on the operator unit 18, the CPU 11 controls various operations of the mixer 10 by, for example, controlling the display of the display section 17, changing allocation of parameters to some of the operators of the operator unit 18, changing the value of the parameter allocated to the operated operator, controlling a monitor operation like a cue operation, etc. Note that the operator unit 18 also includes a fader, an ON key and a cue key per channel to allow the user to individually control each of the input and output channels.

The communication I/F 16 is an interface for connecting the communication I/O 19 to the communication bus 25 to control data transmission and reception (data communication) via the communication I/O 19 in accordance with an instruction given from the CPU 11. The communication I/O 19 is cable of communicating with external devices via a communication network or by pier-to-pier communication.

The DSP 20 is a signal processing means that includes signal processing circuitry for executing microprograms and performs signal processing on audio signals, supplied via the audio bus, in accordance with value of signal processing parameters. Such signal processing is controlled on the basis of values of various parameters stored in the memories (ROM 12 and RAM 13).

The A/D conversion section 22 has functions of converting analog audio signals, input from external equipment via a plurality of input jacks (terminals), into digital audio signals and supplying the thus-converted digital audio signals to the DSP 20 via the audio bus 26. The D/A conversion section 23 has functions of converting digital audio signals of a plurality of channels, received from the DSP 20 via the audio bus 26, into analog audio signals and outputting the thus-converted analog audio signals to external equipment via output jacks associated with the audio signals. The D/D conversion section 24 has functions of demodulating digital audio signals from a transmission frame of a predetermined communication format, such as Dante (registered trademark) or MADI (registered trademark), supplied from external equipment and supplying the demodulated digital audio signals to the DSP 20 via the audio bus 26, and outputting digital audio signals, received from the DSP 20 via the audio bus 26, in a transmission frame of the predetermined communication format.

Further, the audio bus 26 is capable of transferring digital audio signals in a time-divisional manner using a plurality of channels, and each of such channels functions as a signal transfer path for transferring an audio signal from one of the DSP 20 and conversion sections 22, 23 and 24, connected to the audio bus 26, to another of the DSP 20 and conversion sections 22, 23 and 24.

Figure 3:
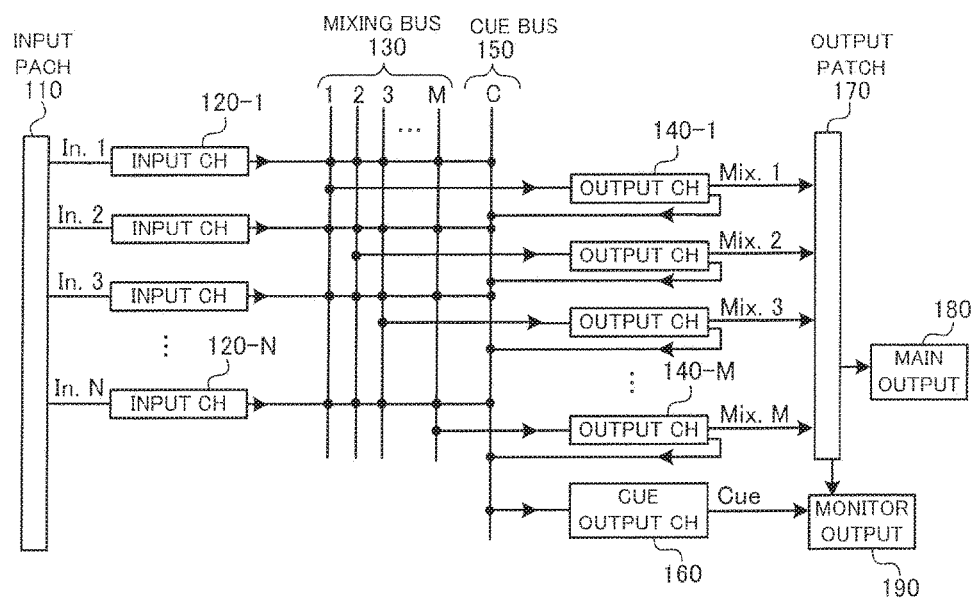
FIG. 3 is a diagram showing a fundamental construction of signal processing performed by a DSP shown in FIG. 2.

FIGS. 3 to 6 show in more detail the construction of the signal processing performed by the DSP 20, conversion sections 22, 23 and 24 and audio bus 26 shown in FIG. 2. As shown in FIG. 3, this signal processing includes: processing of a plurality N of input channels 120-1 to 120-N (sometimes depicted simply by reference numeral 120), processing of a plurality M of busses 130-1 to 130-M (sometimes depicted simply by reference numeral 130) corresponding to a plurality M of output routes, processing of a plurality M of output channels 140-1 to 140-M (sometimes depicted simply by reference numeral 140), processing of one cue bus 150 and processing of one cue (monitor) output channel 160 performed mainly by the DSP 20; and processing of an input patch section 110 and an output patch section 170 performed by the audio bus 26.

The input patch section 110 patches (connects) any one of a plurality of input jacks, provided in corresponding relation to input jacks of the A/D conversion section 22 or D/D conversion section 24 (specifically, virtual input jacks in the case of the D/D conversion section 24), to each of the N input channels 120 consisting of the first input channel 120-1 to the Nth input channel 120-N, and the input patch section 110 supplies an audio signal received from the patched input jack to the input channel.

Figure 4:
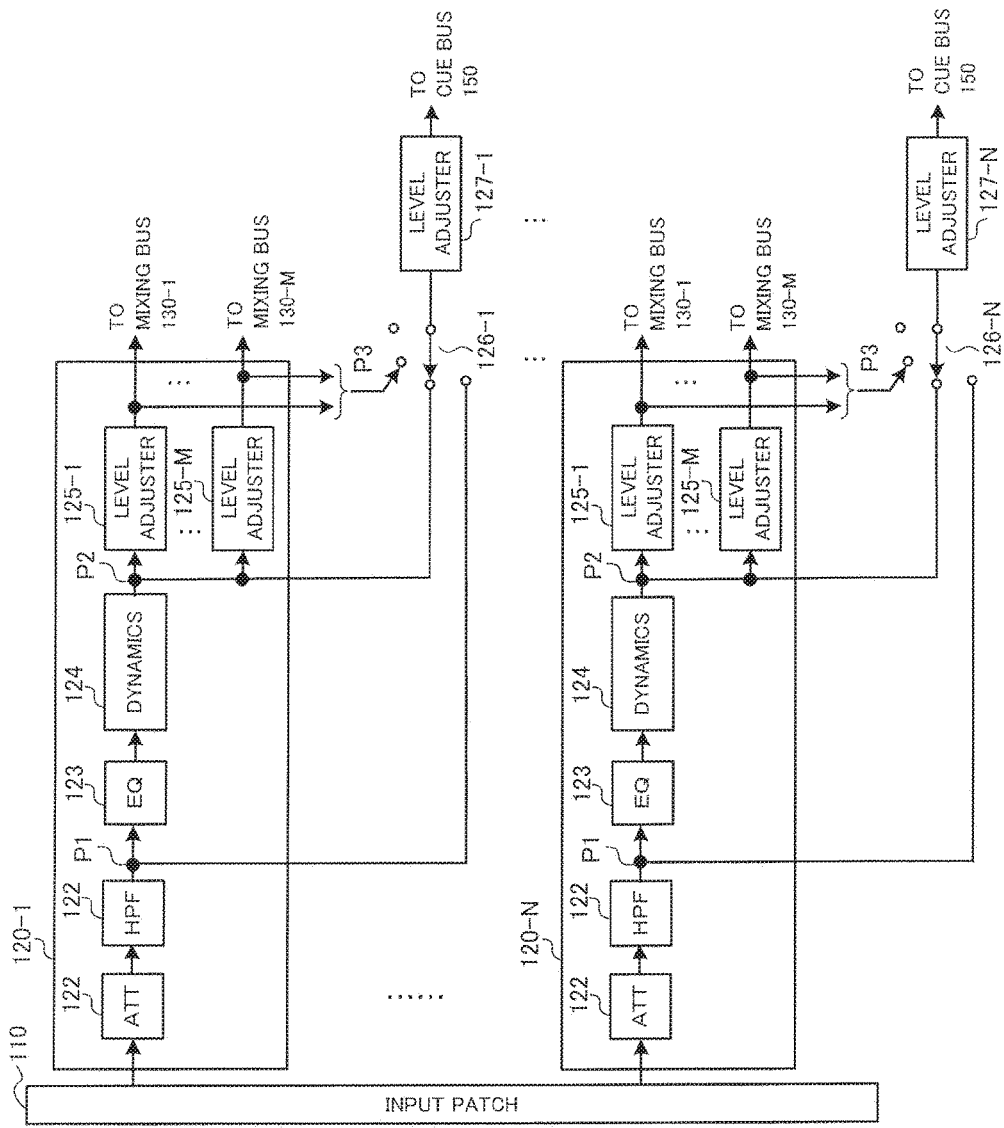
FIG. 4 is a diagram showing an example detailed construction of an input channel shown in FIG. 3 and an example construction of a portion of a preview channel pertaining to the input channel.

FIG. 4 shows an example construction of each of the input channels 120 (120-1 to 120-N). In the input channel 120, element processing by an attenuator (ATT) 121, a high-pass filter (HPF) 122, an equalizer (EQ) 123 and a dynamics adjuster 124 are sequentially performed on an audio signal received from the input jack patched thereto. In such element processing, characteristics of the audio signal that correspond to the individual element processing are controlled in accordance with values of a plurality of parameters. Each of the input channels 120 includes a plurality M of level adjusters 125-1 to 125-M corresponding to the busses 130-1 to 130-M of the M (first to Mth) output routes, so that send gains from the input channel 120 to the individual buses 130-1 to 130-M can be set independently of one another by the level adjusters 125-1 to 125-M. Each of the level adjusters 125-1 to 125-M independently controls the level of the audio signal of the input channel, having been controlled in characteristics as above, in accordance with the send gain to a corresponding one of the buses 130-1 to 130-M, and then it sends the thus-level-controlled audio signal to the corresponding bus 130-1 to 130-M. The level adjusters 125 correspond to the first level adjusters 6 shown in FIG. 1. The send gains for the individual buses 130 set in each of the input channels 120 as above correspond to the "first parameters" for the individual output routes. The first input channel 120-1 to the Nth input channel 120-N are constructed and operate in a similar manner.

Each of the M output route buses 130-1 to 130-M mixes the audio signals supplied from the plurality of input channels 120-1 to 120-N and supplies the resultant mixed audio signal to a corresponding one of the output channels 140-1 to 140-M. Namely, the output channels 140-1 to 140-M are provided in one-to-one corresponding relation to the M buses 130-1 to 130-M, and combinations (pairs) of the buses 130-1 to 130-M and output channels 140-1 to 140-M corresponding to the buses 130-1 to 130-M constitute the M output routes.

Figure 5:
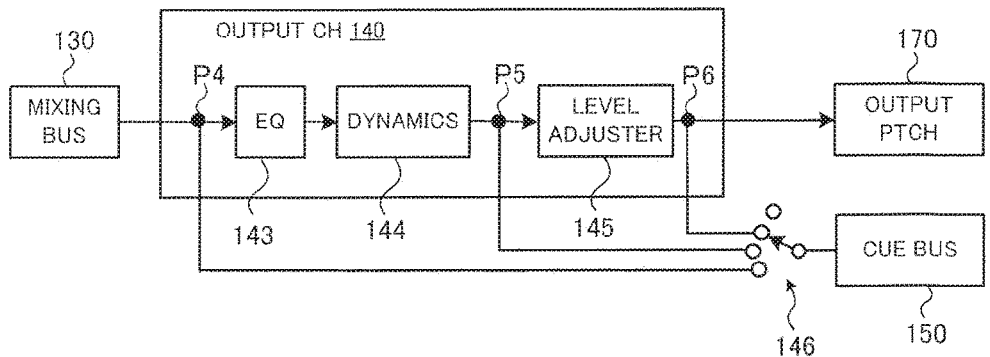
FIG. 5 is a diagram showing an example detailed construction of an output channel shown in FIG. 3.

In each of the output channels 140-1 to 140-M, element processing by an equalizer 143, a dynamics adjuster 144 and a level adjuster 145 is sequentially performed on the audio signal supplied to the output channel, as shown in FIG. 5. In such element processing, processing corresponding to the processing elements is performed on the mixed audio signal, supplied from the corresponding output bus, in accordance with values of a plurality of parameters including a send gain, and the mixed audio signal having been subjected to such signal processing is output to the output patch section 170. A pair of each of the output channels 140 and the bus 130 corresponding to the output channel 140 is herein referred to collectively as "bus channel" (corresponding to the bus channel 3 shown in FIG. 1). The above-mentioned processing elements, equalizer 143, dynamics adjuster 144 and level adjuster 145, correspond to the signal processing section 7 shown in FIG. 1. Parameters for the signal processing by the equalizer 143, dynamics adjuster 144 and level adjuster 145 are the "second parameters".

The output patch section 170 patches each of the output channels 140 to any one of output jacks of the D/A conversion section 23 or D/D conversion section 24 (virtual output jacks in the case of the D/D conversion section 24), and it supplies the audio signal processed by each of the output channels 140 to the output jack having the output channel patched thereto. The output jacks as patch destinations include ones for the main output 180 and ones for the monitor output 190. A main speaker, wedge speaker, etc. are connected to the main output, and a monitor speaker, headphones, etc. are connected to the monitor output 190.

For cuing and previewing purposes, each of the input channels 120 is configured to take out an audio signal at any desired one of a plurality of predetermined audio signal take-out positions P1 to P3, as shown in FIG. 4. The test-listening audio signal (i.e., audio signal to be test-listened to) taken out from any one of the take-out positions P1 to P3 is sent to the cue bus 150. For each of the input channels 120-1 to 120-N, a cue switch 126-1 to 126-N (sometimes indicated simply by reference numeral 126) is provided to allow the audio signal to be taken out from a desired position, as will be later described. The audio signals of the individual input channels 120-1 to 120-N taken out via the corresponding cue switches 126-1 to 126-N are supplied to the corresponding level adjusters 127-1 to 127-N (sometimes indicated simply by reference numeral 127). Respective outputs of the level adjusters 127-1 to 127-N are mixed and then supplied to the cue output channel 160. The level adjusters 127-1 to 127-N, the cue bus 150 and the cue output channel 160 together constitute the preview channel 4.

The cue switch 126-1 to 126-N of each of the input channels 120-1 to 120-N selects any one of contacts connecting respectively to the take-out positions P1 to P3 and a contact connecting to none of the take-out positions P1 to P3 in accordance with a cue ON/OFF parameter for switching between send ON and send OFF (i.e., cue ON and OFF) to the cue bus 150 (i.e., switching between ON and OFF of the audio signal to be sent to the cue bus 150) and a take-out position parameter designating any one of the audio signal take-out positions P1 to P3. A value of the take-out position parameter is set in advance by the user for each of the input channels 120. The mixer 10 operates in any one of a "cue mode" where it perform the same cue process as the conventionally-known mixers and a preview mode where it performs a novel preview process that is characteristic of the present invention. Once the cue key of any one of the input channels is turned on by the user when the mixer 10 is in the cue mode, the CPU 11 controls the cue switch 126 corresponding to that input channel to select any one of the take-out positions P1 to P3 designated by the take-out position parameter. Once the cue key of any one of the input channels is turned off by the user in the cue mode, on the other hand, the CPU 11 controls the cue switch 126 corresponding to that input channel to select the contact connecting to none of the take-out positions P1 to P3. The output of any one of the level adjusters 125-1 to 125-M is selected as the audio signal of the position P3 in the illustrated example, but this feature will not be described in detail because it is not relevant directly to the features of the present invention. Note that the cue switch 126 is a switch for cuing (test-listening to) the corresponding input channel in the cue mode and this switch 26 is not necessarily essential for achieving only an output route preview function according to the present invention. Namely, as will be described later, in the preview mode of the present invention, All the cue switches 120 corresponding to the input channels 120 are controlled to select the take-out position P2 such that the audio signals before being adjusted in level by the level adjusters 125 are directed to the level adjusters 127. Thus, in a case where only the preview mode is executed, the cue switches 126 may be omitted or dispensed with, and arrangements may be made such that the audio signals from the positions P2 are always supplied to the level adjusters 127.

The level adjuster 127 of each of the input channels 120 controls the level of the input channel 120 in accordance with a send gain ("cue gain") (of the audio signal to be sent) to the cue bus 150 and outputs the thus-level-controlled audio signal to the cue bus 150. A sending portion of each of the input channels 120, including the level adjuster 127, for sending the audio signal to the cue bus 150 is used as a portion of the preview channel 4 (second level adjuster 8) shown in FIG. 1. Note that the cue gain of each of the input channels 120 is the "third parameter". Also note that the level adjuster 127 is not necessary for ordinary cuing (test-listening) of the input channel. Namely, when any one of the input channels is to be cued, the third parameter is set at "0 dB" such that the audio signal of the input channel is passed as-is.

Further, each of the output channels 140 too can send an audio signal taken out from any one of three audio signal take-out positions P4 to P6 to the cue bus 150 as an audio signal to be test-listened to (test-listening audio signal). A cue switch 146 of each of the output channels 140 selects any one of contacts connecting respectively to the take-out positions P4 to P6 and a contact connecting to none of the take-out positions P4 to P6 in accordance with a cue ON/OFF parameter and a take-out position parameter designating any one of the contacts connecting the take-out positions P4 to P6 and contact connecting to none of the take-out positions P4 to P6. Once the cue key of any one of the output channels 140 is turned on by the user in the cue mode, the CPU 11 controls the cue switch 146 corresponding to that output channel to select any one of the take-out positions P4 to P6 designated by the take-out position parameter. Once the cue key of any one of the output channels is turned off by the user in the cue mode, on the other hand, the CPU 11 controls the corresponding cue switch 146 to select the contact connecting to none of the take-out positions P4 to P6. In the case of the conventionally-known mixers, an input channel and an output channel cannot be cued on simultaneously. Also note that the present invention is characterized by the preview process in the preview mode rather than by the cue process in the cue mode.

The cue bus 150 mixes one or more audio signals selected via the cue switches 126 or 146 of one or more input channels 120 or output channels 140 and then outputs the resultant mixed audio signal to the cue output channel 160. The cue bus 150 constitutes a portion (second signal processing section 9) of the preview channel 4 of FIG. 1.

In the cue output channel 160, element processing by an attenuator 161, an equalizer 163, a dynamics adjuster 164 and a level adjuster 165 are sequentially performed on the audio signal supplied from the cue bus 150, as shown in FIG. 5. In such element processing, processes corresponding to the processing elements, attenuator 161, equalizer 163, dynamics adjuster 164 and level adjuster 165, are performed on the mixed audio signal input from the cue bus 150 in accordance with values of a plurality of parameters including a send gain, and the resultant processed mixed audio signal is output to the monitor output 190. The respective constructions of the aforementioned equalizer, dynamics adjuster and level adjuster are the same among the input channel 120, output channel 140 and cue output channel 160, and the parameter values for use in the equalizer, dynamics adjuster and level adjuster are interchangeable among the input channel 120, output channel 140 and cue output channel 160. The level adjuster of each of the input channel 120, output channel 140 and cue output channel 160 includes a mute switch (not shown). When the mute switch is ON, the level adjuster mutes the mixed audio signal regardless of the set gain, but when the mute switch is OFF, the level adjuster controls the level of the mixed audio signal in accordance with the set gain without muting the mixed audio signal. In the preview mode, the entire cue output channel 160 is used as a portion (second signal processing section 9) of the preview channel 4 of FIG. 1, and individual parameters for signal processing in the equalizer 143, dynamics adjuster 144 and level adjuster 145 are "fourth parameters".

The monitor output 190 selectively outputs, as a test-listening audio signal, any one of the mixed audio signal from the cue output channel 16 and the mixed audio signal from the output channel 140 patched by the output patch section 170. More specifically, when any one of the cue switches 126 or 146 is ON in the cue mode, the CPU 11 controls the monitor output 190 to output the mixed audio signal sent from the cue output channel 16, while when all of the cue switches 126 or 146 are OFF, the CPU 11 controls the monitor output 190 to selectively output the mixed audio signal of the output channel, selected by the user in advance as an object of test-listening, supplied via the output patch section 170. In the preview mode, on the other hand, when a later-described comparison function is OFF, the CPU 11 controls the monitor output 190 to output the mixed audio signal from the cue output channel 160, while when the later-described comparison function is ON, the CPU 11 controls the monitor output 190 to selectively output the mixed audio signal of the output channel 140, selected by the user in advance as an object of test-listening, supplied via the output patch section 170.

The cue mode is a mode for performing the conventionally-known ordinary cue function, which is a function for allowing the user to test-listen to audio signals of one or more input channels 120 or output channels 140, designated as an object of test-listening (also referred to as "object of cuing"), by test-listening to the audio signal output from the monitor output 190. On the other hand, the preview mode is a mode for performing a special cue function according to the present invention, which is a function for allowing the user to adjust the mixing ratio of a plurality of audio signals in the mixed audio signal of one output channel 140 designated as an object of-test-listening (also referred to as "object of previewing) and adjust signal processing parameters in the mixed audio signal while test-listening to the mixed audio signal of the one output channel 140 via the monitor output 190.

The signal processing by the aforementioned processing sections provided in the DSP 20 is controlled in accordance with values of various parameters, including the above-mentioned first, second, third and fourth parameters, stored in the memory (ROM 12 or RAM 13). Also note that the respective functions of such processing sections may be implemented either by software or by hardware.

Figure 7:
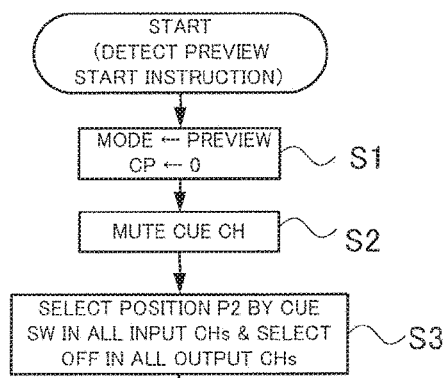
FIG. 7 is a flow chart of a process responsive to a preview start instruction.

Next, a description will be given about processing performed by the CPU 11 of the mixer 10 in relation to the preview mode. FIG. 7 is a flow chart of a preview mode start process that is performed by the CPU 11 in response to a preview start instruction given by the user. A preview key operable by the user to input such a preview start instruction may be, for example, a physical operator on the operator unit 18 or an image of an operator (operator image) displayed on a display (display section 17). Once the preview key is operated when the mode of the cue function is not the preview mode, i.e. when the mode of the cue function is the cue mode, the CPU 11 detects the operation of the preview key as the preview start instruction.

At step S1, the CPU 11 not only sets "preview mode" as a variable MODE indicative of a mode of the cue function but also sets "0" as a variable CP indicative of ON/OFF of the comparison function. Setting "preview mode" as the variable MODE as above causes the mode of the cue function to become the preview mode. Further, setting "0" as the variable CP as above causes the comparison function to become OFF. At next step S2, the CPU 11 turns on the mute switch of the cue output channel 160 to mute the audio signal output from the cue output channel 160.

Then, at step S3, the CPU 11 selects the take-out position P2 via the cue switch 126 for each of the input channels 120 and selects cue-OFF via the cue switch 146 for each of the output channels 140. In the preview mode, according to the illustrated embodiment, the take-out position P2 is selected via the cue switch 126 uniformly for each of the input channels 120, irrespective of a value of the take-out position parameter per input channel 120. However, immediately after the selection of the preview mode, a silent audio signal of a −∞dB level is output to the monitor output 190, i.e. the monitor output 190 does not output an audio signal containing an audible sound, because the audio signal from the cue output channel 160 is muted at step S2 as above.

Figure 8:
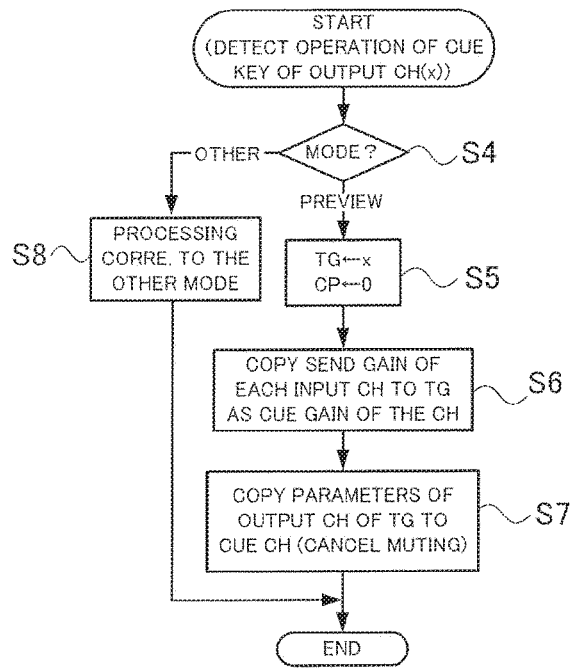
FIG. 8 is a flow chart showing a process responsive to a cue key operation of an output channel.

FIG. 8 is a flow chart showing an example of processing performed by the CPU 11 in response to a user's operation for designating, as an object of test-listening, an xth output channel (output channel (x)) of the plurality of output channels 140. The user's operation for designating, as an object of test-listening, an xth output channel is a tuning-on operation of the cue key of the output channel (x), although such a user's operation may be an operation of an object-of-test-listening designating operator image displayed on the display (display section 17).

At step S4, the CPU 11 determines whether the current value of the variable MODE is indicative of the "preview mode". If the current value of the variable MODE is indicative of the "preview mode" (YES determination at step S4), the CPU 11 goes to step S5, where it sets the designated output channel No. "x" as a variable TG indicative of an output route of an object of test-listening in the preview mode (i.e., an object of previewing) and sets "0" (comparison function OFF) as the variable CP. In this manner, the designated output channel (x) and bus (x) (object-of-previewing bus (x)) corresponding to the output channel (x), i.e., one output route, becomes an object of previewing. The operation for designating an output channel 140 as an object of test-listening in the preview mode corresponds to a "user's preview instruction for previewing any one of the output channels".

Then, at step S6, for each of the input channels 120, the CPU 11 copies values of the send gain of audio signals to be sent from that input channel 120 to the object-of-previewing bus (or previewing bus) (x) as a cue gain of the input channel 120. Namely, copies of the parameters set for the level adjusters 125 in each of the input channels 120 to adjust the audio signal to be sent to the corresponding object-of-previewing bus (x) are set as a parameter (third parameter) for the level adjuster 127-1 to 127-M. In this manner, the audio signal of each of the input channels 120 is sent to the cue bus 150 with the same gain as the send gain from that input channel 120 to the bus (x). Namely, in the cue bus 150, the audio signals of the individual input channels 120 are mixed with the same mixing ratio as in the previewing bus (x). Note that, because the cue gain of each input channel 120 that is not sending the audio signal to the previewing bus (x) is "−∞dB level" (i.e., send-OFF or mute level to the cue bus 150) and hence the audio signal of such an input channel 120 is a silent signal, it can be regarded that the audio signal of such an input channel 120 is not mixed in the cue bus 150.

Further, at step S7, the CPU 11 copies values of the signal processing parameters of the previewing bus (x) as signal processing parameters of the cue output channel 160. Namely, copies of the signal processing parameters (second parameters) of the previewing output channel (x) are set as the signal processing parameters (fourth parameters) of the cue output channel 160. In this manner, the cue output channel 160 is set to perform signal processing, based on the same parameter vales as the previewing output channel (x), on the mixed audio signal supplied from the cue bus 150.

By the aforementioned setting, the muting of the cue output channel 160 is canceled or terminated once the mute switch (not shown) of the level adjuster 165 is turned off. In this manner, the monitor output 190 starts outputting the mixed audio signal of the cue output channel 160. Thus, the user can test-listen, via the monitor output 190, to the same mixed audio signal as the one being output from the previewing output channel (x) to the main output 180.

If the current value of the variable MODE is indicative of another mode than the "preview mode" (NO determination at step S4), on the other hand, the CPU 11 performs processing corresponding to the other mode at step S8. For example, if the current value of the variable MODE is indicative of the "cue mode", the CPU 11 performs an ordinary cue process of the output channel (x). Namely, once the output channel (x) is turned on, the CPU 11 causes the cue switch 146 of the xth output channel 146 to select one of the take-out positions P4 to P6 corresponding to a preset take-out position parameter, so that an audio signal of the selected take-out position is supplied to the cue bus 150. Then, the cue bus 150 mixes audio signals of channels designated as objects of cuing, and the cue output channel 160 processes the resultant mixed audio signal supplied from the cue bus 150 and outputs the thus-processed mixed audio signal via the monitor output 190.

It is assumed here that the mixer 10 is normally used in the cue mode, and the cue mode is switched to the preview mode when necessary. The instant embodiment has been described above in relation to the case where the cue mode is switched to the preview mode first and then the output channel (x) is cued or designated as an object of cuing via the cue key. Alternatively, the output channel (x) may be designated as an object of cuing via the cue key in the cue mode first, and then the cue mode may be switched to the preview mode to start preview of the cued output channel (x). More specifically, in the latter case, the CPU 11 may start cuing the output channel (x) in response to a user operation for cuing-on the output channel (x) in the cue mode (steps S4 and S8 of FIG. 8) and then perform the preview process of the output channel (x) in response to a user's preview mode start instruction (steps S1 to S3 of FIG. 7 and steps S4 to S7 of FIG. 8).

Alternatively, there may be provided a shift key (not shown), and the CPU 11 may perform the preview process of the output channel x in response to the user operating the cue key of the output channel (x) while pressing the shift key. The preview of the output channel x may be ended, in response to the user operating again the cue key of the output channel (x), by the CPU 11 detecting the user's re-operation of the cue key as a preview end instruction.

By performing value adjusting operations after the preview of the output channel (x) has been started through the processes of FIGS. 7 and 8, the user can adjust the cue gain of each of the input channels 120 and the signal processing parameters of the cue output channel 160. Specifically, such value adjusting operations may be performed using particular operators of the operator unit 18 after allocating the cue gains of the individual input channels 120 to operators of the operator unit 18 having the send gains of the individual input channels 120 allocated thereto and temporarily allocating the cue output channel 160 to operators of the operator unit 18 (operator unit's operators) of a channel strip having the output channel (x) allocated thereto. Further, by operating a selection key of that channel strip, the user can use operator unit's operators of a selected channel section for adjusting parameter values of the selected channel.

Figure 9:
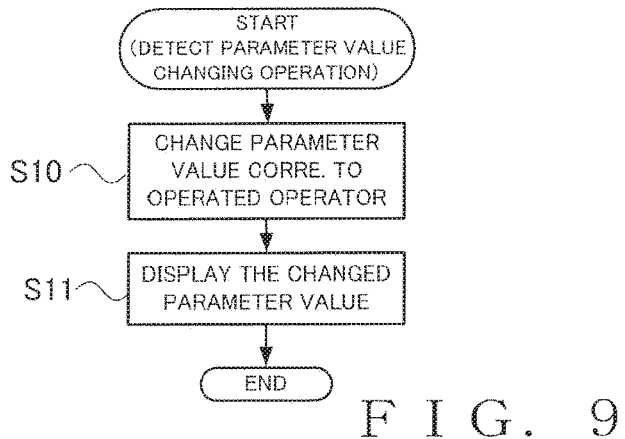
FIG. 9 is a flow chart of a process responsive to a parameter value changing operation in a preview mode.

FIG. 9 is a flow chart of a value change process performed by the CPU 11 in response to a user's operation of any one of the operators of the operator unit 18. The CPU 11 changes a value of any one of parameters, stored in the memory 12 or 13, that corresponds to the operated operator of the operator unit 18 at step S10 and displays the changed parameter value on the display section 17 at step S11. The parameter changed at step S10 as above is reflected in audio signal processing, which is performed by the DSP 20 and the like, through a background process of the CPU 11. As the cue gain of the input channel 120 changes in response to the user's value adjusting operation (step S10), the mixing ratio of the mixed audio signal being test-listened to via the monitor output 190 changes. Further, as the signal processing parameter of the cue output channel 160 changes in response to the user's value adjusting operation (step S10), frequency characteristics, dynamics characteristics, etc. of the mixed audio signal being test-listened to via the monitor output 190 changes.

Namely, once the user instructs previewing of a given channel (x), the same mixing ratio and signal processing parameters as in the object-of-previewing output route are set into the output route (the level adjusters 127 of the individual input channels 120, the cue bus 150 and the cue output channel 160, i.e. the preview channel 4 of FIG. 1) for the monitor output 160, so that the user can test-listen, via the monitor output 190, to the same mixed audio signal as output via the output channel (x) designated as the object of previewing. Further, the user can adjust the third and fourth parameters of the output route for the monitor output 190 and thereby adjust the mixing ratio of the plurality of audio signals in the mixed audio signal to be previewed and signal processing parameters of the to-be-previewed audio signal, without affecting the mixed audio signal output via the main output 180, while listening to tones or sounds of the monitor output 190.

Note that, if the signal processing parameters of the cue output channel 160 are set in such a manner that, in response to the user instructing cue-on of any one of the output channels (object-of-cuing output channel (x)) in the cue mode, an audio signal is caused to pass through the cue output channel 160 as-is without being processed, the user can test-listen, via the monitor output 190, to the same mixed audio signal as supplied via the object-of-cuing output channel (x). Further, by adjusting the signal processing parameters of the cue output channel 160, the user can adjust characteristics of the audio signal of the output channel (x) while listening to the audio signal of the monitor output 190. In this case (in the cue mode), however, the user cannot adjust the mixing ratio of the plurality of audio signals without affecting the mixed audio signal output via the main output 180, while listening to the audio signal of the monitor output 190, as he or she can adjust in the preview mode.

Further, the mixer 10 has the comparison function for selectively supplying the monitor output 190 with any of the to-be-previewed mixed audio signal of the output channel (x) output from the cue output channel 160 and the original mixed audio signal of the output channel (x), to allow the user to auditorily compare the to-be-previewed mixed audio signal and the original mixed audio signal. Because the comparison function is initially set to an OFF state (variable CP=0 at step S5 above) at the start of the preview mode, the monitor output 190 outputs the to-be-previewed mixed audio signal output from the cue output channel 160, until the user gives a comparison instruction for switching to the comparison function. The user gives such a comparison instruction when he or she wants to compare the mixed audio signal output from the cue output channel 160 with the original mixed audio signal of the output channel (x). A comparison key operable by the user to give such a comparison instruction may be, for example, in the form of a physical operator included in the operator unit 18 or an image of an operator (operator image) displayed on the display (display section 17). As an example, the comparison key may be one whose ON/OFF state is readily identifiable by the user, such as an illuminated switch whose N/OFF state is indicated by its light-on/off state.

Figure 10:
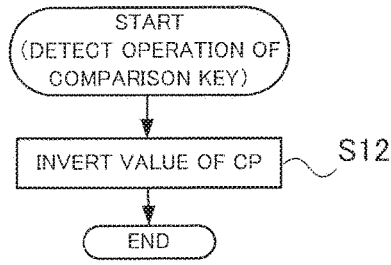
FIG. 10 is a flow chart of a process responsive to an operation of a comparison key in the preview mode.

FIG. 10 is a flow chart of a switching-to-comparison process performed by the CPU 11 in response to a user's operation of the comparison key. At step S12, the CPU 11 inverts the value of the variable CP. Once the value of the variable CP changes from 0 to 1 so that the comparison function becomes ON, the CPU 11 not only controls the output patch section 170 to supply the mixed audio signal of the previewing output channel (x) to the output jack for the monitor output 190 but also controls the monitor output 190 to output the original mixed audio signal supplied from the previewing output channel (x) in place of the audio signal from the cue output channel 160. Once the value of the variable CP changes from 1 to 0 so that the comparison function becomes OFF, the CPU 11 controls the monitor output 190 to output the mixed audio signal supplied from the cue output channel 160 in place of the mixed audio signal supplied from the previewing output channel (x). With such a comparison function, the user can auditorily compare the mixed audio signal supplied from the cue output channel 160 and the original mixed audio signal supplied from the output channel (x).

Further, the mixer 10 has an application function for, in response to an application instruction given by the user, applying values of the third and fourth parameters adjusted by the user in the preview mode, to an output route designated as an object of previewing (i.e., previewing output route). The application instruction may be input by the user operating either a physical operator or an image of an operator displayed on the display section 17.

Figure 11:
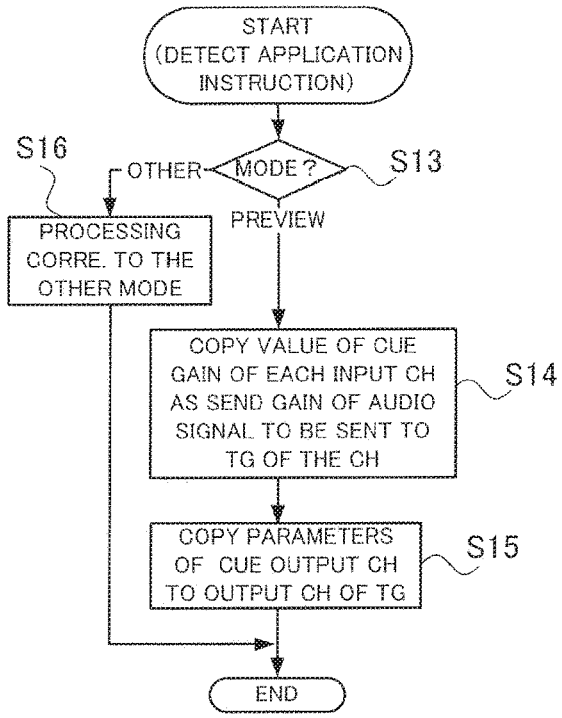
FIG. 11 is a flow chart of a process responsive to an application instruction in the preview mode.

FIG. 11 is a flow chart of an application process performed by the CPU 11 in response to the application instruction. When the cue function mode is the preview mode ("PREVIEW" at step S13), the CPU 11 copies values of the cue gains (third parameters) of each of the input channels 120 as send gains of audio signals to be sent to the bus (x) of the previewing output route corresponding to the input channel 120, at step S14. Namely, the third parameter values of each of the input channels 120 are set as the first parameters for the output route corresponding to the input channel. In this manner, in the level adjusters 125 of each of the input channels 120 are set, as the send gains of the audio signals to be sent to the bus (x), the same values as the cue gains of the input channel 120. Thus, the audio signals of the individual input channels 120 are mixed in the previewing bus (x) with the same mixing ratio as in the cue bus 150. Further, at step S15, the CPU 11 copies values of signal processing parameters of the cue output channel 160 as values of signal processing parameter of the output channel (x) of the previewing output route. Namely, a value of the fourth parameter is set as the second parameter of the bus channel corresponding to the previewing output route. In this manner, the previewing output channel (x) is set to perform signal processing, based on the same parameters as in the cue output channel 160, on the mixed audio signal of the corresponding bus (x). Note that, when the cue function mode is other than the preview mode ("OTHER" at step S13), the CPU 11 performs a process corresponding to the other mode at step S16.

Figure 12:
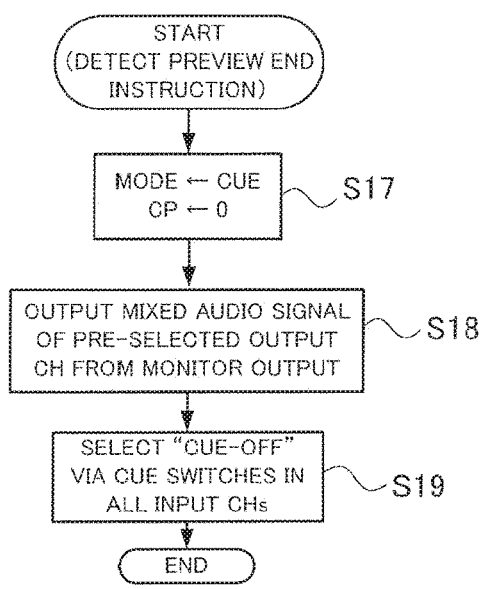
FIG. 12 is a flow chart of a process responsive to a preview end instruction.

FIG. 12 is a flow chart of a preview mode end process performed by the CPU 11 in response to a preview end instruction given by the user. For example, once the preview key is operated in the preview mode, the CPU 11 detects the operation of the preview key as a preview end instruction. At step S17, the CPU 11 sets "CUE MODE" as the variable MODE and sets "0" as the variable CP. At next step S18, the CPU 11 controls the output patch section 170 and monitor output 190 and causes the monitor output 190 to output the mixed audio signal from one output channel 140 selected in advance by the user. Then, at step S19, the CPU 11 causes the cue switches 126 of all of the input channels 120 to select "CUE-OFF". In this manner, sending of the audio signals from all of the input channels 120 (and all of the output channels 140) to the cue bus 150 is turned off, after which the mixer 10 performs processing in the cue mode.

For each of the input channels 120 in the above-described embodiment, the user may make a setting, per bus 130, as to whether or not to bypass the EQ 123 and dynamics adjuster 124 (i.e., "bypass" setting or "not bypass" setting). Namely, to each bus for which the "bypass" setting has been made by the user, the audio signal at the take-out position P1 is supplied after being controlled in level by the level control section 125 in each of the input channels 120. On the other hand, to each bus for which the "not bypass" setting has been made by the user, the audio signal at the take-out position P1 is supplied after being processed by the EQ 123 and dynamics adjuster 124 and controlled in level by the level control section 125 in each of the input channels 120. In this case, instead of the take-out position P2 being uniformly selected in each of the input channels 120 in the preview mode (step S3 above), the same take-out position as the audio signal take-out position connecting to the bus (x) of the previewing output route may be selected.

Figure 6:
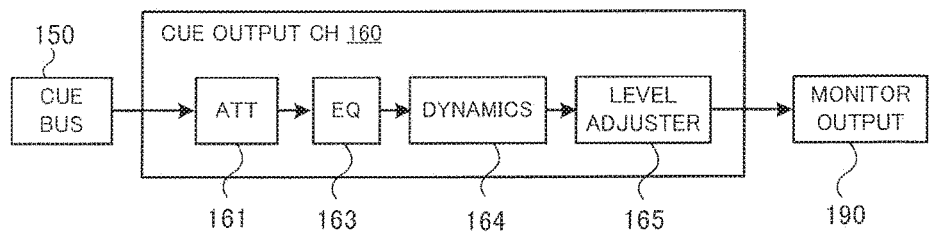
FIG. 6 is a diagram showing an example detailed construction of a cue channel shown in FIG. 3 as the remaining portion of the preview channel.

Furthermore, the signal processing constructions of the input channel 120, output channel 140 and cue output channel 160 are not necessarily limited to those illustrated in FIGS. 4 to 6. For example, whereas the input channel 120, output channel 140 and cue output channel 160 in the illustrated example have been described above as including both the EQ and the dynamic element, the channels may include only any one of the EQ and the dynamic element or may include a plurality of the dynamic elements. Alternatively, the input channel 120, output channel 140 and cue output channel 160 may include, as their common processing elements, other processing elements than the EQ and the dynamic element. Note, however, that, for the preview purpose, the cue output channel 160 should include processing elements corresponding to those of the output channel 140.

Furthermore, in the mixer 10, the send gain of each of the input channel 120 may include, in addition to a single gain value, a value of a mute switch ON/OFF parameter for switching between a setting for allowing the audio signal to be sent to the buses 130 and a setting for not allowing the audio signal to be sent to the buses 130. In such a case, the CPU 11 sets a cue gain of the input channel 120 on the basis of the gain value and value of the ON/OFF parameter of the input channel 120.

According to another embodiment of the invention, the mixer 10 may include a plurality of previewing routes (i.e., a plurality of sets of input-specific cue switches 126 and level adjusters 127, cue buses 150, cue output channels 160 and monitor output 190). Such a plurality of previewing routes are usable by a plurality of users for different applications. In this case, each of the users can adjust the mixing ratio and signal processing parameters of an audio signal to be previewed independently of the other user using the other previewing route.

In each of the above-described embodiments, the CPU 11 and performing the processes of FIGS. 7 to 12 correspond to the supply section 5. More specifically, steps S6 and S7 performed by the CPU 11 correspond to: copying, in accordance with a preview instruction for a given output route, the first parameters for the output route of each of the input channels as the corresponding third parameters of the second level adjusters 8 in the preview channel; and copying the second parameters of the output channel corresponding to the above-mentioned given output route as the fourth parameters of the preview channel. Further, step S10 performed by the CPU 11 corresponds to changing, in response to a value adjustment instruction, the third parameters or fourth parameters of the preview channel.

Whereas various embodiments of the present invention have been described above in detail, it should be appreciated that the present invention is not necessarily limited to the above-described embodiments and may be modified variously within the scope of the technical ideal disclosed in the claims, description and drawings.

For example, the audio processing apparatus 1 of the present invention is also applicable to a recorder, amplifier, processor, etc. other than the mixer 10. Further, the audio processing apparatus 1 of the present invention may comprise a dedicated hardware apparatus (integrated circuitry etc.) constructed to perform the functions of the components 2 to 9 shown in FIG. 1. Alternatively, the audio processing apparatus 1 may comprise a processor apparatus having functions to execute a program for performing the functions of the components 2 to 9 shown in FIG. 1.

Furthermore, the present invention is applicable to a DAW (Digital Audio Workstation) software application, such as Cubase (registered trademark) or ProTools (registered trademark), or a video editing software application.

This application is based on, and claims priority to, Japanese Patent Application No. 2017-026255 filed on 15 Feb. 2017. The disclosure of the priority application, in its entirety, including the drawings, claims, and the specification thereof, are incorporated herein by reference.

What is claimed is:

1. An audio processing apparatus comprising:
   a plurality of input channels, each of the input channels including first level adjusters that adjust a level of an input audio signal in accordance with first parameters set separately for individual ones of a plurality of output routes and send resultant level-adjusted audio signals to the individual output routes;
   a plurality of bus channels provided in corresponding relation to the plurality of output routes, each of the bus channels being configured to mix the audio signals sent from the plurality of input channels and outputting a resultant mixed audio signal to a main output after processing the mixed audio signal in accordance with a second parameter and;
   a preview channel including a plurality of second level adjusters that, in accordance with third parameters set separately for the individual input channels, adjust the audio signals taken out from the plurality of input channels, the preview channel being configured to mix the audio signals having been adjusted in level by the second level adjusters and output a resultant mixed audio signal to a monitor output after processing the mixed audio signal in accordance with a fourth parameter; and
   a processor configured to:
      in response to a preview instruction given by a user for previewing any one output route of the output routes, set a copy of the first parameter for the one output route of each of the input channels as the third parameter corresponding to the input channel in the preview channel, and set a copy of the second parameter of the bus channel corresponding to the one output route as the fourth parameter of the preview channel; and
      in response to an adjustment instruction given by the user, change a value of the third or fourth parameter of the preview channel.

2. The audio processing apparatus as claimed in claim 1, wherein the processor is configured to, in response to the adjustment instruction given by the user, change the value of the third parameter of the preview channel independently for each of the plurality of second level adjusters.

3. The audio processing apparatus as claimed in claim 1, wherein the processor is configured to, in response to the adjustment instruction given by the user, change the value of the fourth parameter of the preview channel.

4. The audio processing apparatus as claimed in claim 3, wherein the fourth parameter includes at least one of an equalizer parameter, dynamics parameter and level-adjusting parameter.

5. The audio processing apparatus as claimed in claim 1, wherein the processor is further configured to, in response to a comparison instruction given by the user, output to the monitor output the mixed audio signal output from the bus channel corresponding to the one output route, in place of the mixed audio signal output from the preview channel.

6. The audio processing apparatus as claimed in claim 1, wherein the processor is further configured to, in response to an application instruction given by the user, set the value of the third parameter of each of the input channels as the first parameter for the output route of the input channel for which the preview instruction has been given, and set the value of the fourth parameter as the second parameter of the bus channel corresponding to the output route for which the preview instruction has been given.

7. A method for previewing a parameter set in an audio processing apparatus, the audio processing apparatus including: a plurality of input channels, each of the input channels including first level adjusters that adjust a level of an input audio signal in accordance with first parameters set separately for individual ones of a plurality of output routes and send resultant level-adjusted audio signals to the individual output routes; a plurality of bus channels provided in corresponding relation to the plurality of output routes, each of the bus channels being configured to mix the audio signals sent from the plurality of input channels and outputting a resultant mixed audio signal to a main output after processing the mixed audio signal in accordance with a second parameter and; a preview channel including a plurality of second level adjusters that, in accordance with third parameters set separately for the individual input channels, adjust the audio signals taken out from the plurality of input channels, the preview channel being configured to mix the audio signals having been adjusted in level by the second level adjusters and output a resultant mixed audio signal to a monitor output after processing the mixed audio signal in accordance with a fourth parameter,
   the method comprising:
      in response to a preview instruction given by a user for previewing any one output route of the output routes, setting a copy of the first parameter for the one output route of each of the input channels as the third parameter corresponding to the input channel in the preview channel, and setting a copy of the second parameter of the bus channel corresponding to the one output route as the fourth parameter of the preview channel; and
      in response to an adjustment instruction given by the user, changing a value of the third or fourth parameter of the preview channel.

8. A non-transitory computer-readable storage medium storing a program executable by one or more processors for performing a method for previewing a parameter set in an audio processing apparatus, the audio processing apparatus including: a plurality of input channels, each of the input channels including first level adjusters that adjust a level of an input audio signal in accordance with first parameters set separately for individual ones of a plurality of output routes and send resultant level-adjusted audio signals to the individual output routes; a plurality of bus channels provided in corresponding relation to the plurality of output routes, each of the bus channels being configured to mix the audio signals sent from the plurality of input channels and outputting a resultant mixed audio signal to a main output after processing the mixed audio signal in accordance with a second parameter and; a preview channel including a plurality of second level adjusters that, in accordance with third parameters set separately for the individual input channels, adjust the audio signals taken out from the plurality of input channels, the preview channel being configured to mix the audio signals having been adjusted in level by the second level adjusters and output a resultant mixed audio signal to a monitor output after processing the mixed audio signal in accordance with a fourth parameter, the method comprising:
in response to a preview instruction given by a user for previewing any one output route of the output routes, setting a copy of the first parameter for the one output route of each of the input channels as the third parameter corresponding to the input channel in the preview channel, and setting a copy of the second parameter of the bus channel corresponding to the one output route as the fourth parameter of the preview channel; and
in response to an adjustment instruction given by the user, changing a value of the third or fourth parameter of the preview channel.

* * * * *